United States Patent

Ransijn

[11] Patent Number: 5,945,847
[45] Date of Patent: Aug. 31, 1999

[54] DISTRIBUTED AMPLIFIER LOGIC DESIGNS

[75] Inventor: Johannes Gerardus Ransijn, Wyomissing Hills, Pa.

[73] Assignee: Lucent Technologies, Murray Hill, N.J.

[21] Appl. No.: 08/858,968

[22] Filed: May 20, 1997

[51] Int. Cl.⁶ .............................................. H03K 19/094
[52] U.S. Cl. .............................. 326/115; 326/112; 326/55
[58] Field of Search ................................... 326/9, 10, 17, 326/52–55, 83, 86, 112, 115, 119

[56] References Cited

U.S. PATENT DOCUMENTS

| | | | |
|---|---|---|---|
| 4,562,365 | 12/1985 | Redfield | 326/55 |
| 5,008,568 | 4/1991 | Leung et al. | 326/83 |

FOREIGN PATENT DOCUMENTS

| | | | |
|---|---|---|---|
| 2133946 | 8/1984 | United Kingdom | 326/68 |

OTHER PUBLICATIONS

Horenstein, Microelectronic circuits and devices, Prentice-Hall, p. 564, 1990.
"Distributed Amplification", E.L. Ginzton et al; Proceedings of the I.R.E., Aug. 1948, pp. 956 et seq.
"On Distributed Amplification", D.G. Sarma, Proceedings of the I.E.E., Sep. 1955, pp. 689 et seq.
"Distributed amplifiers: survey of the effects of lumped–transmission–line design on performance", W.K. Chen et al, Proceedings of the I.E.E., Apr. 1967.
"Distributed amplification: A New Approach", W.K. Chen, IEEE Transactions on Election Devices, vol. ED–14, No. 4, Apr. 1967, pp. 215 et seq.
"IF Amplifier Using $C_c$ Compensated Transistors", J.A. Mataya et al, IEEE Journal of Solid–State Circuits, vol. SC–3, No. 4, Dec. 1968, pp. 401 et seq.
"An outline of Design Techniques for Linear Integrated Circuits", H.R. Camenzind et al, IEEE Journal of Solid–State Circuits, vol. SC–4, No. 3, Jun. 1969, pp. 110 et seq.
"A DC–12 MHz Monolithic GaAsFET Distributed Amplifier", E.W. Strid et al, IEEE Transactions on Microwave Theory and Techniques, vol. MTT–30, No. 7, Jul. 1982, pp. 969 etseq.
"Gain and Bandwidth Characteristics . . . ", J. Choma, Jr., IEEE Transactions on Circuits and Systems, vol. CAS–33, No. 1, Jan. 1986, pp. 66 et seq.
"Coupled–Wave Small–Signal Transient Analysis . . . ", K. Han et al, IEEE Transactions on Microwave Theory and Techniques, vol. 38, No. 1, Jan. 1990, pp. 23 et seq.
"A Low–Power Wide Band Amplifier . . . ", T. Wakimoto et al, IEEE Journal of Solid–State Circuits, vol. 25, No. 1, Feb. 1990, pp. 200 et seq.
"Capacitive Feedback Technique for Wide–Band Amplifiers", M. Vadipour, IEEE Journal of Solid–State Circuits, vol. 28. No. 1, Jan. 1993, pp. 90 et seq.
"A New Compensation Technique . . . ", M. Vadipour, IEEE Journal of Solid–State Circuits, vol. 28, No. 1, Jan. 1993, pp. 93 et seq.

*Primary Examiner*—Jon Santamauro
*Assistant Examiner*—Don Phu Le

[57] ABSTRACT

A high speed logic module is formed to include a differential input formed as a pair of inductive transmission lines and a differential output also formed as a pair of inductive transmission lines. A pair of logic devices are included in the module, with the gate terminals of the devices coupled to separate ones of the input inductive transmission lines. The output terminals of the logic devices are coupled to separate ones of the pair of output inductive transmission lines. The effects of the intrinsic gate-to-drain capacitance $C_{gd}$ inherent in each logic device is compensated for by including a pair of cross-coupled neutralizing capacitors between the drain and gate terminals of the logic devices. Various logic circuits, such as oscillators, latches, delay lines, etc. can be formed using the differential, neutralized structure of the invention.

38 Claims, 6 Drawing Sheets

DISTRIBUTED AMPLIFIER LOGIC DESIGNS

BACKGROUND OF THE INVENTION

1. Field of the Invention

The present invention relates to distributed amplifier logic designs and, more particularly, to logic designs utilizing differential input and output pairs for each logic gate in combination with input and output inductive transmission lines and neutralizing capacitance elements to increase the operating speed of such logic devices.

2. Description of the Prior Art

In the design of high speed logic circuits there is an on-going need for wideband amplifiers. Wideband amplification has been provided in the past by using a distributed amplifier design. One such design is described in the article entitled "A DC-12 GHz Monolithic GaAsFET Distributed Amplifier" by E. W. Strid et al. appearing in *IEEE Transactions on Microwave Theory and Techniques*, Vol. MTT-30, No. 7, July 1982 at pages 969 et seq. In the Strid et al. article, a multi-stage FET amplifier is described that uses an inductive input, an inductive output (the input and output being the respective gate and the drain terminals of the GaAsFET device).

In a distributed arrangement such as the Strid et al. design mentioned above, there remains an intrinsic capacitance between the gate and the drain of each amplifying device (denoted $C_{gd}$). This intrinsic capacitance is problematic in that it results in the input of each stage being coupled to its associated output, as well as for each stage to be coupled together. Therefore, the operation of any particular stage is impacted by all previous stages as well as all subsequent stages in the multi-stage design. This interrelationship complicates the design of a multi-stage arrangement and has limited the application of distributed techniques to amplifiers. Thus, a need remains in the art to expand the application of distributed techniques to logic circuit designs.

SUMMARY OF THE INVENTION

The need remaining in the prior art is addressed by the present invention, which relates to distributed amplifier logic designs and, more particularly, to logic designs utilizing differential input and output pairs for each logic gate in combination with input and output inductive transmission lines and neutralizing capacitance elements to increase the operating speed of such logic devices.

In accordance with the present invention, the speed limitation in prior art logic circuit designs is overcome by forming logic devices in a distributed amplifier architecture using differential input (gate) and output (drain) lines. The differential inputs are formed as an input inductive transmission line ($L_{in}$) and the differential outputs are similarly formed as an output inductive transmission line (Lout). The intrinsic gate-to-drain capacitance $C_{gd}$ of the pair of emitter-coupled logic devices forming each differential pair may be effectively neutralized in accordance with the present invention by including cross-coupled compensation capacitors between the gate and drain terminals of the pair of logic devices. In general, the technique of the present invention to generalize the type of neutralization that may be utilized. For example, in the intrinsic element was inductive in characteristic, then the neutralizing element would be inductive. For the particular embodiments discussed in detail hereinbelow, the intrinsic element is capacitive; thus, the neutralizing element is capacitive as well.

It is an aspect of the present invention that the basic logic module including an input differential transmission line, an output differential transmission line and a pair of cross-coupled neutralizing capacitors can be applied to the design of any desired logic device, as well as to "mixed" signal circuits, that is, circuits including both analog and logic devices.

Other and further aspects of the present invention will become apparent during the course of the following discussion, and by reference to the accompanying drawings.

BRIEF DESCRIPTION OF THE DRAWINGS

Referring now to the drawings, where like numerals represent like parts in several views.

DETAILED DESCRIPTION

Figure 1:
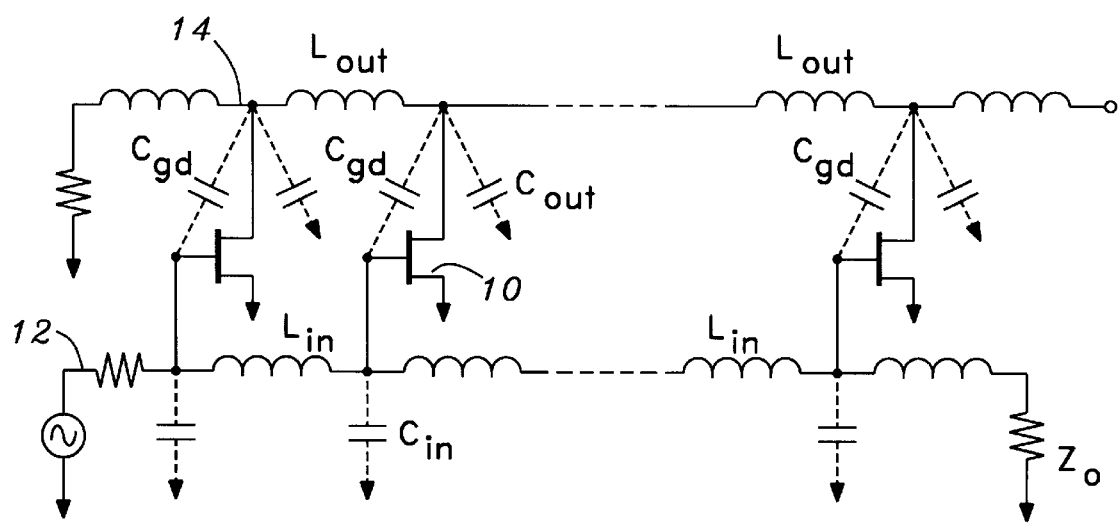
FIG. 1 illustrates, in simplified form, a prior art distributed amplifier arrangement.

A simplified illustration of a distributed amplifier is shown in FIG. 1, where this distributed amplifier is similar in form to the Strid et al. design mentioned above. As shown, a first stage amplifier includes an amplifying device 10, such as an FET, with its gate coupled to an input transmission line 12 and its drain coupled to an output transmission line 14. The intrinsic capacitances, denoted as $C_{in}$ and $C_{out}$ in FIG. 1, are considered as components of input transmission line 12 and output transmission line 14, respectively. Therefore, the bandwidth $\omega_c$ for this first stage is defined as follows:

$$\omega_c = \frac{1}{\sqrt{L_{in}C_{in}}} = \frac{1}{\sqrt{L_{out}C_{out}}}.$$

Consequently, the overall gain of an amplifier can be increased by adding stages, while the overall bandwidth can be maintained at this $\omega_c$ value. The gain-bandwidth product is thus increased and exceeds that of a single stage. However, an intrinsic capacitance that exists between the gate and drain regions of the FET, denoted $C_{gd}$, results in coupling between the input transmission line and the output transmission line. This interdependence makes it difficult to separately tune the input and output, hampering the overall amplifier design.

Figure 2:
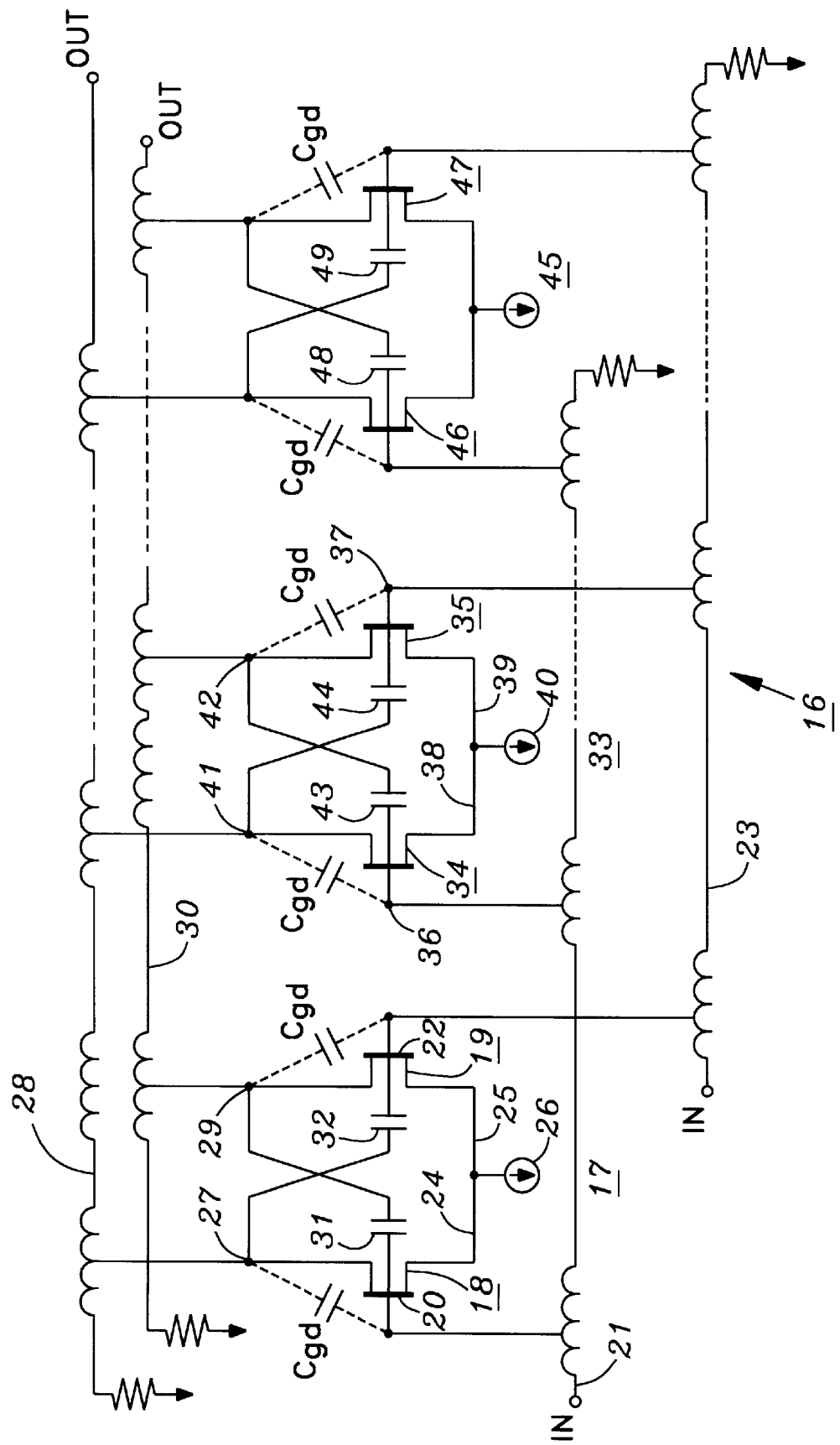
FIG. 2 illustrates an exemplary distributed amplifier arrangement formed in accordance with the present invention.

FIG. 2 illustrates a distributed amplifier 16 including differential inputs and outputs formed in accordance with the present invention. The arrangement of FIG. 2 is intended to parallel that of FIG. 1 in terms of illustrating the first two stages, as well as the last stage, of a multi-stage distributed amplifier. As discussed above, the utilization of a differential amplifier design to form an exemplary logic device functions to decouple the input transmission line from the output transmission line, and the cross-coupled neutralizing capacitors are used to "cancel" the effects of the intrinsic capacitance $C_{gd}$. Referring to FIG. 2, a first amplifier stage 17 of distributed amplifier 16 includes a pair of logic devices 18 and 19. The differential input of first stage 17 is formed by coupling gate 20 of device 18 to a first input inductive transmission line 21 and coupling gate 22 of device 19 to a second input inductive transmission line 23. The source 24 of device 18 is coupled to the source 25 of device 19, and sources 24,25 are also coupled to a supply 26. The differential output of first stage 17 is formed by coupling drain terminal 27 of device 18 to a first output inductive transmission line 28 and coupling drain 29 of device 19 to a second output inductive transmission line 30.

The presence of the intrinsic gate-to-drain capacitances associated with devices 18 and 19 (denoted as $C_{gd}$ and illustrated in phantom in FIG. 2) can be essentially neutralized by utilizing an additional pair of capacitors to "null" the effect of the intrinsic devices. As shown in FIG. 2, a first neutralizing capacitor 31 is coupled between the gate 20 of device 18 and the drain 29 of device 19. Similarly, a second neutralizing capacitor 32 is coupled between the gate 22 of device 19 and the drain 27 of device 18. Neutralizing capacitors 31,32 are chosen to have values essentially identical to that attributed to the intrinsic capacitances so as to provide the maximum amount of neutralization.

In order to provide the wideband operation required for the requisite speed of current logic devices (i.e., approximately 10 Gb/s), it is necessary to utilize a multi-stage configuration, such as that shown in FIG. 2. Although only three such stages are illustrated, it is to be understood that the number of actual stages included in any design is merely a matter of design choice and the ultimate circuit requirements. Referring to FIG. 2, a second amplifier stage 33 is essentially identical in design to first stage 17. Second stage 33 includes a pair of logic devices 34 and 35, where the gate terminals 36 and 37, respectively are coupled to pair of input inductive transmission lines 21 and 23. The source terminals 38 and 39 of devices 34 and 35 are tied together and coupled to a source supply 40. Drain terminals 41 and 42 of devices 34 and 35, respectively, are coupled to the pair of differential output inductive transmission lines 28 and 30. A pair of neutralizing capacitors 43 and 44 are cross-coupled between the drain and gate terminals of devices 34 and 35. Output stage 45 of distributed amplifier 16 similarly includes a pair of logic devices 46 and 47, as well as neutralizing capacitors 48 and 49.

Figure 3:
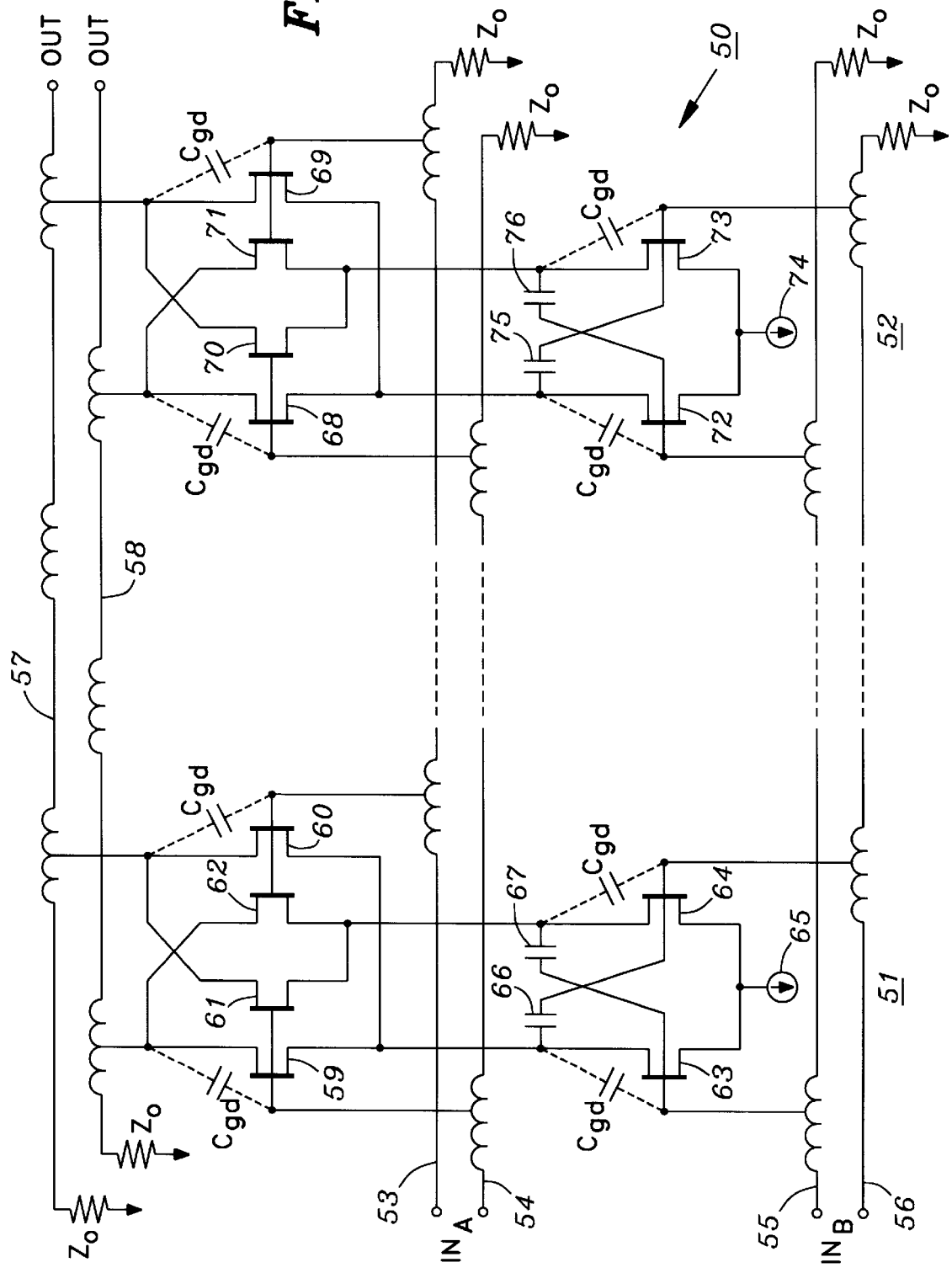
FIG. 3 contains a schematic of an exemplary exclusive-OR logic circuit formed utilizing the neutralized logic module of the present invention.

FIG. 3 illustrates an exemplary distributed exclusive-OR logic circuit 50 formed using the design techniques discussed above. As with the arrangement of FIG. 2, exclusive-OR logic circuit 50 may comprise a plurality of stages, where only an input stage 51 and output stage 52 are illustrated in detail. Exclusive-OR logic circuit 50 includes a first differential pair of input inductive transmission lines 53,54, denoted as "$IN_A$" in FIG. 3. The second input to exclusive-OR logic circuit 50, referring to as "$IN_B$" is formed by a second differential pair of input inductive transmission lines 55,56. The output from exclusive-logic circuit 50 also includes a pair of inductive transmission lines, denoted as 57 and 58 in FIG. 3. Referring in particular to input stage 51, a first pair of logic devices 59 and 60 are coupled between $IN_A$ and the output, with the gate of device 59 coupled to input inductive transmission line 54 and the gate of device 60 coupled to input inductive transmission line 53. As shown, the drain of device 59 is coupled to output inductive transmission line 58 and the drain of device 60 is coupled to output inductive transmission line 57. As an attribute of the exclusive-OR function, an additional pair of logic devices 61 and 62 are cross-coupled as shown between logic devices 59 and 60. In particular, the gate of logic device 61 is coupled to input inductive transmission line 54 and the drain of device 61 is coupled to output inductive transmission line 57. Similarly, the gate of logic device 62 is coupled to input inductive transmission line 53 and the drain of device 62 is coupled to output inductive transmission line 58. Advantageously, the utilization of the cross-coupled pair of logic devices 61 and 62 provides the requisite "neutralization" for the illustrated intrinsic capacitance $C_{gd}$ associated with logic devices 59 and 60. Thus, further neutralization of these devices is not required.

The remaining input, $IN_B$, of exclusive-OR logic circuit 50 is applied, in first stage 51, to another pair of logic devices 63 and 64. In particular, the gate of logic device 63 is coupled to input inductive transmission line 55 and the gate of logic device 64 is coupled to input inductive transmission line 56. The source terminals of devices 63 and 64 are tied together and coupled to a source supply 65. In order to achieve the required exclusive-OR functionality, the drain of logic device 63 is coupled to the source terminals of logic devices 59 and 60, as shown in FIG. 3. Similarly, the drain of logic device 64 is coupled to the source terminals of logic devices 61 and 62. In accordance with the teachings of the present invention, the intrinsic capacitance $C_{gd}$ associated with logic devices 63 and 64, illustrated in phantom, is effectively neutralized by including a pair of capacitors 66 and 67 coupled between devices 63 and 64. As shown, first neutralizing capacitor 66 is coupled between the drain of device 63 and the gate of device 64, while second neutralizing capacitor 67 is coupled between the drain of device 64 and the gate of device 63.

As discussed above, wideband high speed performance in logic circuits is achieved by utilizing a distributed design of multiple differential logic stages. Thus, for exclusive-OR logic circuit 50 of FIG. 3, the input applied along the pairs of inductive transmission lines forming $IN_A$ and $IN_B$ will be applied to subsequent logic stages, in a manner essentially identical as that described above with input stage 51. Illustrated in particular in FIG. 3 is the output stage 52 of exclusive-OR logic circuit 50, which will now be briefly described. As shown, the differential input logic signal $IN_A$ propagating along input inductive transmission lines 53 and 54 are applied as inputs to the gate terminals of a first pair of logic devices 68 and 69 (the gate of device 68 being coupled to input transmission line 54 and the gate of device 69 being coupled to input transmission line 53). The drain terminals of devices 68 and 69 are coupled to the pair of output differential transmission lines 57 and 58. A second pair of logic devices 70 and 71 are cross-coupled between first logic devices 68 and 69 and are similarly coupled at their respective gate terminals to input transmission lines 53 and 54, and at their drain terminals to output transmission lines 57 and 58. As with the arrangement of input stage 51, the presence of this second pair of logic devices 70 and 71 provides the required "neutralization" for the intrinsic capacitance $C_{gd}$ associated with logic devices 68 and 69. A last pair of logic devices 72 and 73 are included in output stage 52, as shown in FIG. 3, to receive the differential second input signal $IN_B$ propagating along input inductive transmission lines 55 and 56. The source terminals of devices 72 and 73 are coupled together and also coupled to a source supply 74. As shown in FIG. 3, the exclusive-OR function is achieved by coupled the drain terminal of logic device 72 to the source terminals of both logic devices 68 and 69. Similarly, the drain terminal of logic device 73 is coupled to the source terminals of logic devices 70 and 71. Neutralization of the intrinsic capacitance $C_{gd}$ associated with devices 72 and 73 is achieved, in accordance with the present invention, by including a pair of capacitors 75 and 76 as shown. In particular, first neutralizing capacitor 75 is coupled between the drain of logic device 72 and the gate of logic device 73 and second neutralizing capacitor 76 is coupled between the drain of logic device 73 and the gate of logic device 72.

Figure 4:
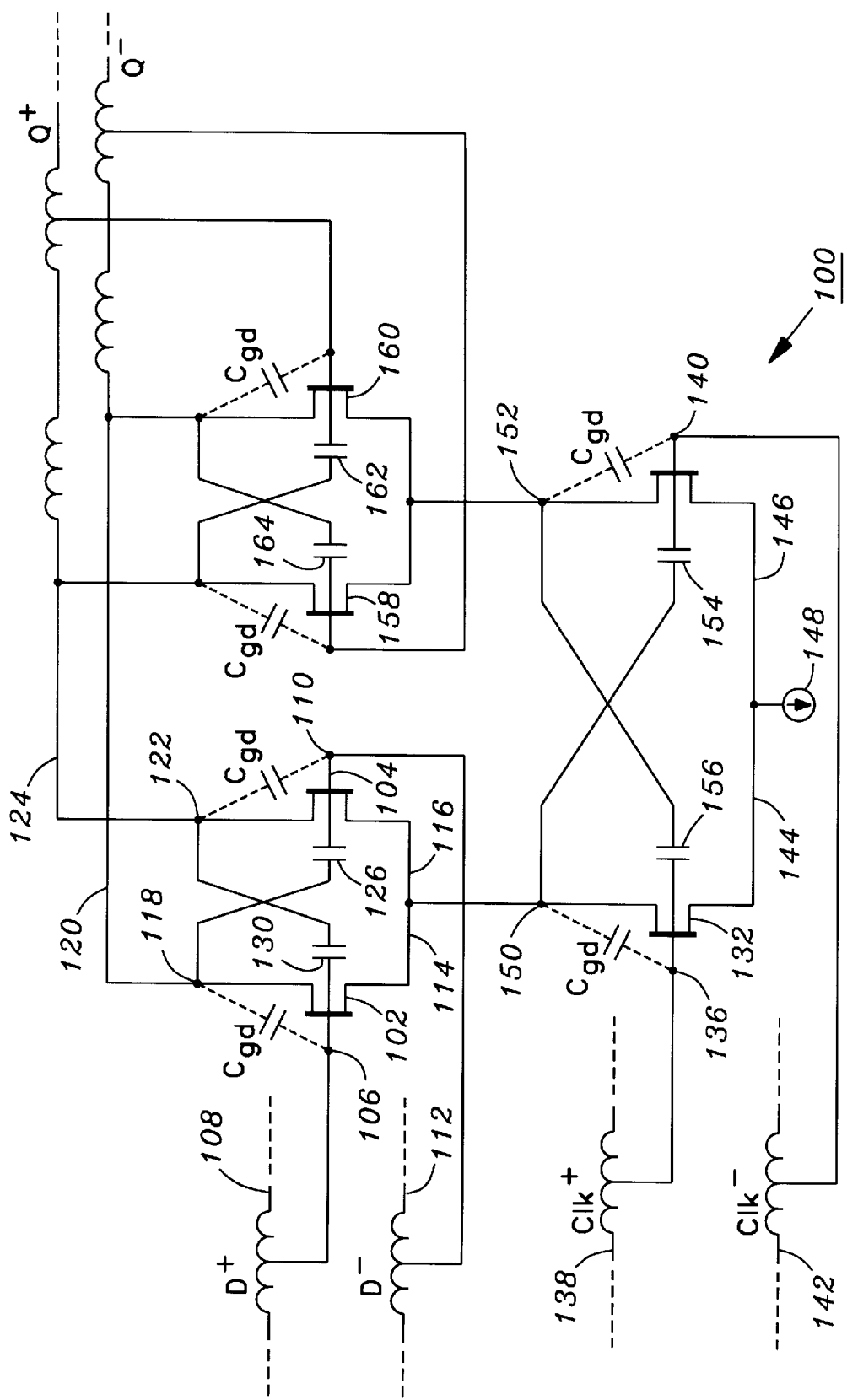
FIG. 4 contains a schematic diagram of a distributed latch circuit forming utilizing a number of neutralized logic modules formed in accordance with the teachings of the present invention.

A single stage 100 of a distributed latch circuit, in particular a D flip-flop, formed using the teachings of the present invention is illustrated in FIG. 4. It is to be understood, as indicated by the dashed lines in FIG. 4, that such a latch will contain multiple stages, a single stage being illustrated for the sake of clarity. As shown, distributed latch 100 includes a first, "master" pair of logic devices 102 and 104. A differential input to distributed latch 100 (denoted as the "D" input for operation as a D-type flip-flop) is formed by coupling the gate terminal 106 of device 102 to a first input transmission line 108 (defined as the D$^+$ input) and coupling the gate terminal 110 of device 104 to a second input transmission line 112 (defined as the D$^-$ input). The source terminals 114 and 116 of devices 102 and 104, respectively, are coupled together and controlled by a separate differential module, defined as a clock module and described in detail hereinafter. The differential output from latch 100 (denoted as the "Q" output for operation as a D-type flip-flop) is formed by coupling the drain terminal 118 of device 102 to a first output transmission line 120 (defined as the Q$^-$ output) and coupling the drain terminal 122 of device 104 to a second output transmission line 124 (defined as the Q$^+$ output).

The intrinsic capacitances $C_{gd}$ are illustrated in phantom in FIG. 4. A pair of neutralizing capacitors 126, 130 are included in the logic structure of the present invention to essentially "null out" the presence of this intrinsic capacitance. In particular, first neutralizing capacitor 126 is coupled between the drain 118 of device 102 and the gate 110 of device 104 and second neutralizing capacitor 130 is coupled between the drain 122 of device 104 and the gate 106 of device 102.

As mentioned above, a differential clock module is used to control the operation of distributed latch 100. In particular, the clock module includes a differential pair of logic devices 132 and 134, where the gate input 136 of device 132 is coupled to a first clock transmission line 138 (denoted as Clk$^+$ in FIG. 4) and the gate input 140 of device 134 is coupled to a second clock transmission line 142 (denoted as Clk$^-$ in FIG. 4). Source terminals 144 and 146 of devices 132 and 134, respectively, are coupled together and also coupled to a supply 148. The drain terminals of devices 132 and 134 form the clock outputs, where drain terminal 150 of device 132 is coupled the source terminals 114,116 of devices 102 and 104, as described above. Similarly, drain terminal 152 of device 134 is coupled to a pair of source terminals of the output stage of latch 100, as will be described hereinafter.

Intrinsic capacitances $C_{gd}$ associated with devices 132 and 134 are illustrated in phantom. In accordance with the teachings of the present invention, the presence of this intrinsic capacitance is effectively neutralized by including a first neutralizing capacitor 154 between the drain 150 of device 132 and the gate 140 of device 134 and a second neutralizing capacitor 156 between the drain 152 of device 134 and the gate 136 of device 132.

The arrangement of latch 100 further includes a "slave" differential pair of devices 158 and 160, as shown in FIG. 4.

In particular, the differential gate input to devices 158 and 160 is formed by coupling the gate of device 158 to first output line 120 and the gate of device 160 to second output line 124. The sources of devices 158 and 160 are coupled to the differential clock module, in particular, to drain 152 of device 134. The differential output from devices 158,160 is formed by coupling the drain of device 158 to output line 124 (output Q$^+$) and coupling the drain of device 160 to output line 120 (output Q$^-$). As with every differential logic stage formed in accordance with the teachings of the present invention, a pair of neutralizing capacitors 162, 164 are cross-coupled between the drain and gate terminals of devices 158 and 160. In particular, capacitor 162 is coupled between the drain of device 158 and the gate of device 160, while capacitor 164 is coupled between the drain of device 160 and the gate of device 158. It is to be understood that various other resistive and capacitive components may be used to form the completed design of latch 100, where theses components are not germane to the discussion of the formation of differential logic stages including neutralizing capacitors, as taught by the present invention.

Figure 5:
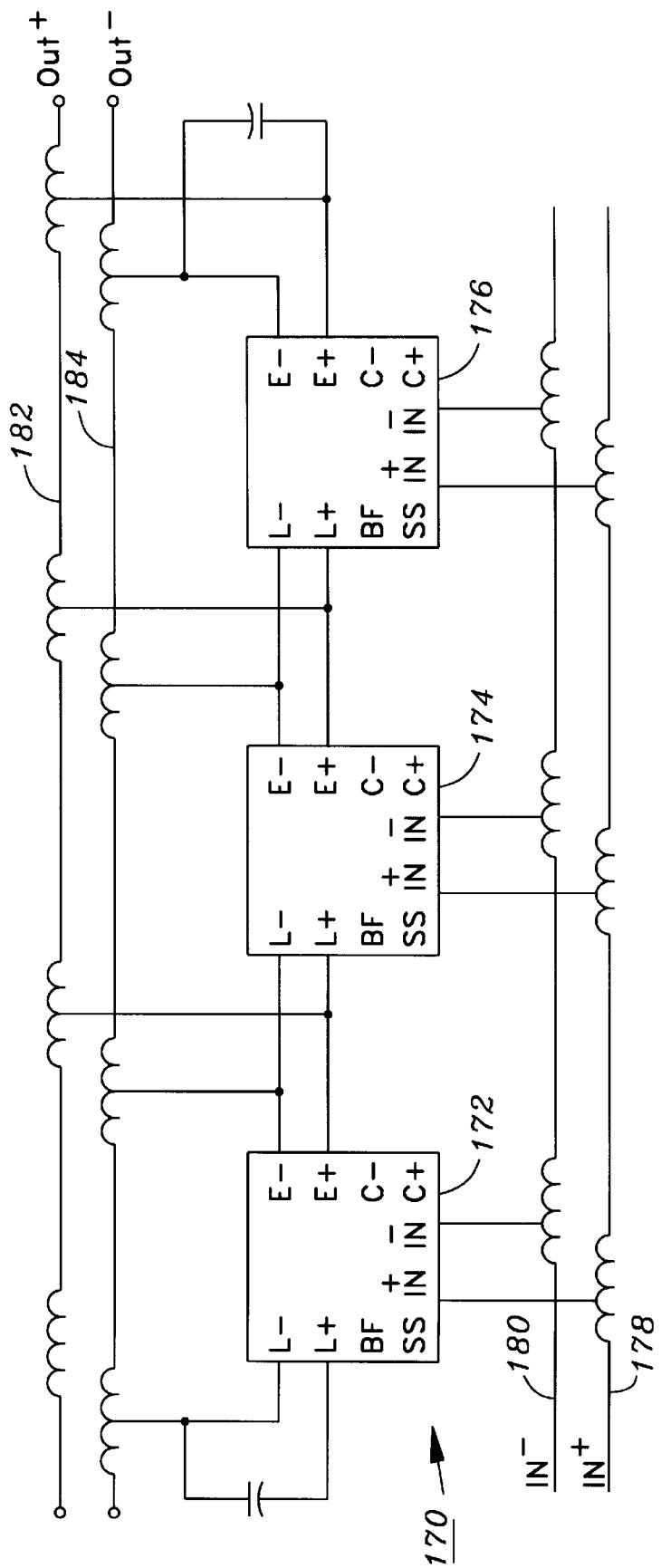
FIG. 5 illustrates, in block diagram form, an exemplary multi-stage distributed voltage-controlled delay line formed using the differential techniques of the present invention.
Figure 6:
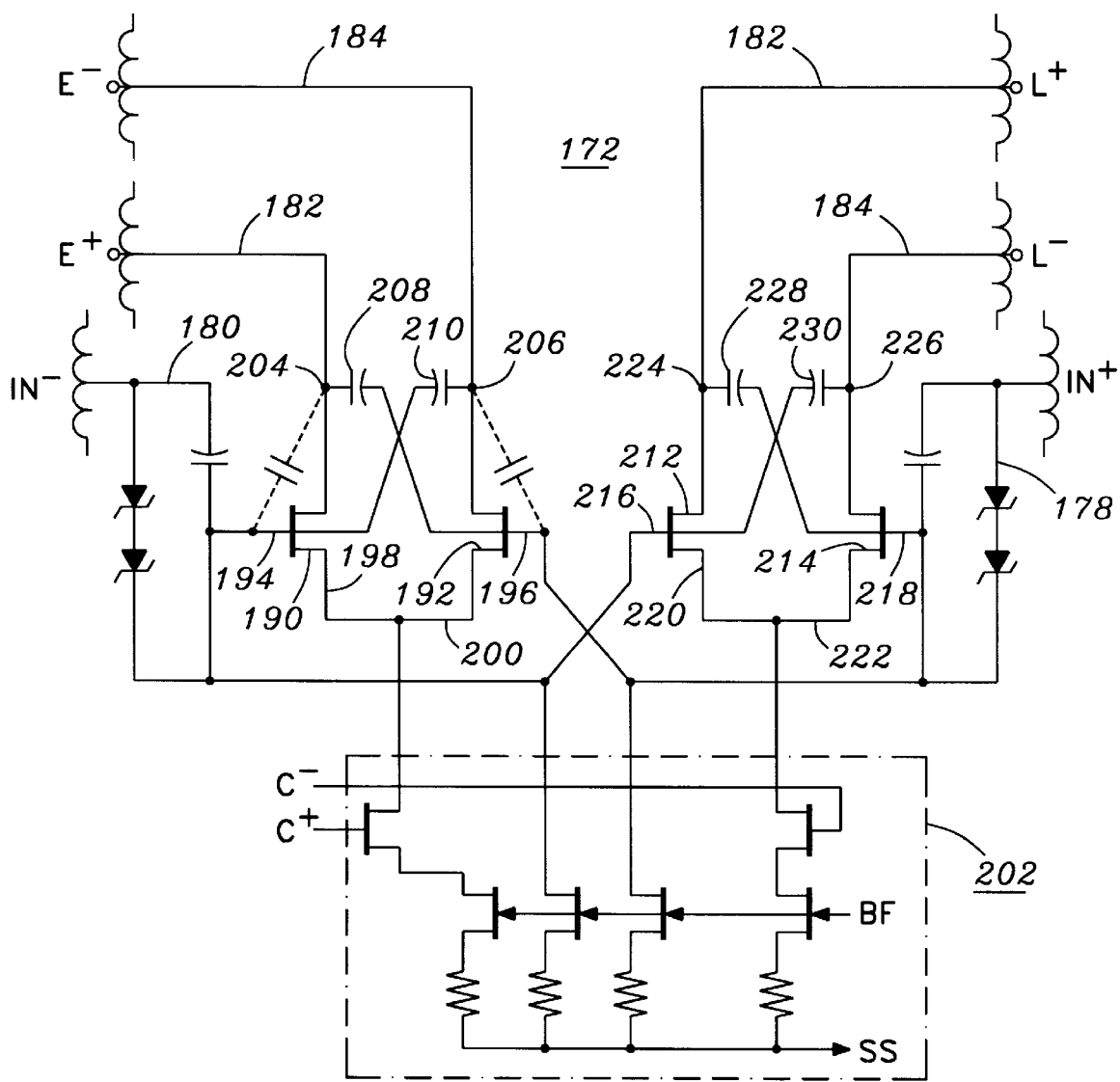
FIG. 6 contains a schematic diagram of a single stage of the voltage-controlled delay line of FIG. 5.

A multi-stage voltage-controlled delay line 170 formed in accordance with the present invention is shown in FIG. 5. Delay line 170 includes three separate stages 172, 174 and 176, where an exemplary stage is illustrated in FIG. 6. A differential input is formed by a pair of transmission lines 178 and IN$^+$ and IN$^-$, respectively, in FIG. 5. The differential output of delay line 170 comprises a pair of transmission lines 182 and 184, denoted as OUT$^+$ and OUT$^-$ in FIG. 5. Stage 172 is shown in particular in FIG. 6 and includes a first pair of logic devices 190 and 192. The differential input is formed by coupling the gate terminal 194 of device 190 to second input transmission line 180 (IN$^-$) and coupling the gate terminal 196 of device 192 to first input transmission line 178 (IN$^+$). The source terminals 198, 200 of devices 190 and 192, respectively, are coupled together and controlled by a delay module 202, as shown in FIG. 6. The differential output is formed by coupling the drain terminal 204 of device 190 to first output transmission line 182 and coupling the drain terminal 206 of device 192 to second output transmission line 184. Intrinsic capacitances $C_{gd}$ are compensated for by including a first neutralizing capacitor 208 between drain 204 of device 190 and gate 196 of device 192 and a second neutralizing capacitor 210 between the drain 206 of device 192 and gate 194 of device 190.

A second differential pair of logic devices 212 and 214 are included in first stage 172, as shown in FIG. 6. The differential input to devices 212,214 is formed by coupling the gate 216 of device 212 to the second input transmission line 180 and the gate 218 of device 214 to the first input transmission line 178. Source terminals 220 and 222 are coupled together and applied as an input to delay module 202, as shown in FIG. 6. The differential output from the pair of devices 212,214 is formed by coupling the drain 224 of device 212 to first output transmission line 182 and coupling the drain 226 of device 214 to second output transmission line 184. Neutralizing capacitors 228 and 230 are included as shown, where first neutralizing capacitor 228 is coupled between the drain 224 of device 212 and the gate 218 of device 214, and second neutralizing capacitor 230 is coupled between the drain 226 of device 214 and the gate 216 of device 212.

What is claimed is:
1. A high speed logic module comprising
   a pair of logic devices, each device including a gate terminal, a drain terminal and a source terminal, the source terminals being coupled to receive a predetermined signal;

a differential input comprising a pair of transmission lines, each input transmission line coupled to a separate one of the gate terminals of said pair of logic devices;

a differential output comprising a pair of transmission lines, each output transmission line coupled to a separate one of the drain terminals of said pair of logic devices; and a pair of neutralizing reactive elements, a first neutralizing reactive element coupled between said drain terminal of a first logic device of said pair of logic devices and said gate terminal of a second logic device of said pair of logic devices, and a second neutralizing reactive element coupled between said drain terminal of said second logic device and said gate terminal of said first logic device.

2. A logic module as defined in claim 1 wherein the reactive elements comprise capacitive elements.

3. A logic module as defined in claim 2 wherein each neutralizing capacitor is formed to comprise a value essentially equal to an intrinsic capacitance existing between the gate and the drain of each logic device.

4. A logic module as defined in claim 1 wherein the input and output transmission lines comprise inductive transmission lines.

5. A logic module as defined in claim 1 wherein the reactive elements comprise additional logic devices.

6. A multi-stage logic device comprising a differential input comprising a pair of transmission lines;

a differential output comprising a pair of transmission lines; and a plurality of logic modules coupled between the differential input and the differential output, each logic module comprising a pair of logic devices, each device including a gate terminal, a drain terminal, and a source terminal, the source terminals being coupled to receive predetermined signals, each gate terminal coupled to a separate one of the pair of input transmission lines, and each drain terminals coupled to a separate one of the pair of output transmission lines; and a pair of neutralizing reactive elements, a first reactive element coupled between said drain terminal of a first logic device of said pair of logic devices and said gate terminals of a second logic device of said pair of logic devices, and a second neutralizing reactive coupled between said drain terminal of said second logic device and said gate terminal of said first logic device.

7. A multi-stage logic device as defined in claim 6 wherein each reactive element comprises a capacitor.

8. A multi-stage logic device as defined in claim 7 wherein each neutralizing capacitor is formed to comprise a value essentially equal to an intrinsic capacitance existing between the gate and the drain of each logic device.

9. A multi-stage logic device as defined in claim 6 wherein the reactive elements comprise logic devices.

10. A multi-stage logic device as defined in claim 6 wherein the input and output transmission lines are inductive transmission lines.

11. A distributed exclusive-OR logic circuit comprising a plurality of differential exclusive-OR logic modules, said exclusive-OR logic circuit including a first differential input comprising a first pair of input transmission lines;

a second differential input comprising a second pair of input transmission lines;

a differential output comprising a pair of output transmission lines; and a plurality of exclusive-OR logic modules, each exclusive-OR logic module comprising a first pair of logic devices, each device including a drain terminal, a gate terminal and a source terminal, coupled between said first pair of input transmission lines and said pair of output transmission lines;

a second pair of logic devices, each device including a drain terminal, a gate terminal and a source terminal, coupled between said first pair of input transmission lines and said pair of output transmission lines, said second pair of logic devices disposed in a cross-coupled relationship with said first pair of logic devices in a manner whereby said second pair of logic devices provides neutralization to the intrinsic capacitance associated with said first pair of logic devices;

a third pair of logic devices, each device including a drain terminal, a gate terminal and a source terminal, coupled between said second pair of input transmission lines and said pair of output transmission lines; and a pair of neutralizing reactive elements, a first neutralizing reactive element coupled between the drain terminal of a first logic device and gate terminals of a second logic device of said third pair of logic devices and a second neutralizing reactive element coupled between the drain terminal of said second device and the gate terminal of said first device of said third pair of logic devices.

12. A distributed exclusive-OR logic circuit as defined in claim 11 wherein the neutralizing reactive elements comprise capacitors.

13. A distributed exclusive-OR logic circuit as defined in claim 12 wherein each neutralizing capacitor is formed to comprise a value essentially equal to an intrinsic capacitance existing between the gate and the drain of each logic device.

14. A distributed exclusive-OR logic circuit as defined in claim 11 wherein the neutralizing reactive elements comprise logic devices.

15. A distributed exclusive-OR logic circuit as defined in claim 11 wherein each input transmission line and output transmission line comprises an inductive transmission line.

16. A distributed latch circuit comprising a differential signal input comprising a pair of signal input transmission lines;

a differential clock input comprising a pair of clock input transmission lines;

a differential output comprising a pair of output transmission lines; and a plurality of latch logic circuit modules, each latch logic circuit module comprising a first pair of logic devices, each including a gate terminal, a drain terminal and a source terminal, the gate terminals of said first pair of logic devices coupled to separate ones of said pair of signal input transmission lines and the drain terminals of said first pair of logic devices coupled to separate ones of said pair of output transmission lines;

a first pair of neutralizing reactive elements disposed in a cross-coupled arrangement between the drain and gate terminals of said first pair of logic devices;

a second pair of logic devices, each including a gate terminal, a drain terminal, and a source terminal, the gate terminals of said second pair of logic devices being coupled to separate ones of said pair of output transmission lines and the drain terminals of said second pair of logic devices coupled, in an opposing arrangement, to said pair of output transmission lines such that the gate and drain terminals of each device are coupled to different output transmission lines;

a second pair of neutralizing reactive elements disposed in a cross-coupled arrangement between the drain and gate terminals of said second pair of logic devices;

a third pair of logic devices, each including a gate terminal, a drain terminal and a source terminal, the gate terminals of said third pair of logic devices being coupled to separate ones of said pair of clock input transmission lines, the source terminals being coupled together and applied to a power supply, the drain terminal of a first device of said third pair of logic devices being coupled to both source terminals of said first pair of logic devices and the drain terminal of a second device of said third pair of logic devices being coupled to both source terminals of said second pair of logic devices; and a third pair of neutralizing reactive elements disposed in a cross-coupled arrangement between the drain and gate terminals of said third pair of logic devices.

17. A distributed latch circuit as defined in claim 16 wherein each reactive elements comprises a capacitor.

18. A distributed latch circuit as defined in claim 17 wherein each neutralizing capacitor is formed to comprise a value essentially equal to an intrinsic capacitance existing between the gate and the drain of each logic device.

19. A distributed latched circuit as defined in claim 16 wherein the pair of signal input transmission lines comprise inductive transmission lines, the pair of clock input transmission lines comprise inductive transmission lines and the pair of output transmission lines comprise inductive transmission lines.

20. An integrated circuit including a high speed logic module comprising a pair of logic devices, each device including a gate terminal, a drain terminal and a source terminal, the source terminals being coupled to receive a predetermined signal;

a differential input comprising a pair of transmission lines, each input transmission line coupled to a separate one of the gate terminals of said pair of logic devices;

a differential output comprising a pair of transmission lines, each output transmission line coupled to a separate one of the drain terminals of said pair of logic devices; and a pair of neutralizing reactive elements, a first neutralizing reactive element coupled between said drain terminal of a first logic device of said pair of logic devices and said gate terminal of a second logic device of said pair of logic devices, and a second neutralizing reactive element coupled between said drain terminal of said second logic device and said gate terminal of said first logic device.

21. An integrated circuit as defined in claim 20 wherein the reactive elements comprise capacitive elements.

22. An integrated circuit as defined in claim 21 wherein each neutralizing capacitor is formed to comprise a value essentially equal to an intrinsic capacitance existing between the gate and the drain of each logic device.

23. An integrated circuit as defined in claim 20 wherein the input and output transmission lines comprise inductive transmission lines.

24. An integrated circuit as defined in claim 20 wherein each reactive element comprises an additional logic device.

25. An integrated circuit including a multi-stage logic device comprising a differential input comprising a pair of transmission lines;

a differential output comprising a pair of transmission lines; and a plurality of logic modules coupled between the differential input and the differential output, each logic module comprising a pair of logic devices, each device including a gate terminal, a drain terminal, and a source terminal, the source terminals being coupled to receive predetermined signals, each gate terminal coupled to a separate one of the pair of input transmission lines, and each drain terminals coupled to a separate one of the pair of output transmission lines; and a pair of neutralizing reactive elements, a first reactive element coupled between said drain terminal of a first logic device of said pair of logic devices and said gate terminals of a second logic device of said pair of logic devices, and a second neutralizing reactive coupled between said drain terminal of said second logic device and said gate terminal of said first logic device.

26. An integrated circuit as defined in claim 25 wherein each reactive element comprises a capacitor.

27. An integrated circuit as defined in claim 26 wherein each neutralizing capacitor is formed to comprise a value essentially equal to an intrinsic capacitance existing between the gate and the drain of each logic device.

28. An integrated circuit as defined in claim 25 wherein the reactive elements comprise logic devices.

29. An integrated circuit as defined in claim 25 wherein the input and output transmission lines are inductive transmission lines.

30. An integrated circuit including a distributed exclusive-OR logic circuit comprising a plurality of differential exclusive-OR logic modules, said exclusive-OR logic circuit including a first differential input comprising a first pair of input transmission lines;

a second differential input comprising a second pair of input transmission lines;

a differential output comprising a pair of output transmission lines; and a plurality of exclusive-OR logic modules, each exclusive-OR logic module comprising a first pair of logic devices, each device including a drain terminal, a gate terminal and a source terminal, coupled between said first pair of input transmission lines and said pair of output transmission lines;

a second pair of logic devices, each device including a drain terminal, a gate terminal and a source terminal, coupled between said first pair of input transmission lines and said pair of output transmission lines, said second pair of logic devices disposed in a cross-coupled relationship with said first pair of logic devices in a manner whereby said second pair of logic devices provides neutralization to the intrinsic capacitance associated with said first pair of logic devices;

a third pair of logic devices, each device including a drain terminal, a gate terminal and a source terminal, coupled between said second pair of input transmission lines and said pair of output transmission lines; and a pair of neutralizing reactive elements, a first neutralizing reactive element coupled between the drain terminal of a first logic device and gate terminals of a second logic device of said third pair of logic devices and a second neutralizing reactive element coupled between the drain terminal of said second device and the gate terminal of said first device of said third pair of logic devices.

31. An integrated circuit as defined in claim 30 wherein the neutralizing reactive elements comprise capacitors.

32. An integrated circuit as defined in claim 31 wherein each neutralizing capacitor is formed to comprise a value essentially equal to an intrinsic capacitance existing between the gate and the drain of each logic device.

33. An integrated circuit as defined in claim 30 wherein each neutralizing reactive element comprises a logic device.

34. An integrated circuit defined in claim 30 wherein each input transmission line and output transmission line comprises an inductive transmission line.

35. An integrated circuit comprise a distributed latch circuit comprising
- a differential signal input comprising a pair of signal input transmission lines;
- a differential clock input comprising a pair of clock input transmission lines;
- a differential output comprising a pair of output transmission lines; and
- a plurality of latch logic circuit modules, each latch logic circuit module comprising
  - a first pair of logic devices, each including a gate terminal, a drain terminal and a source terminal, the gate terminals of said first pair of logic devices coupled to separate ones of said pair of signal input transmission lines and the drain terminals of said first pair of logic devices coupled to separate ones of said pair of output transmission lines;
  - a first pair of neutralizing reactive elements disposed in a cross-coupled arrangement between the drain and gate terminals of said first pair of logic devices;
  - a second pair of logic devices, each including a gate terminal, a drain terminal, and a source terminal, the gate terminals of said second pair of logic devices being coupled to separate ones of said pair of output transmission lines and the drain terminals of said second pair of logic devices coupled, in an opposing arrangement, to said pair of output transmission lines such that the gate and drain terminals of each device are coupled to different output transmission lines;
  - a second pair of neutralizing reactive elements disposed in a cross-coupled arrangement between the drain and gate terminals of said second pair of logic devices;
  - a third pair of logic devices, each including a gate terminal, a drain terminal and a source terminal, the gate terminals of said third pair of logic devices being coupled to separate ones of said pair of clock input transmission lines, the source terminals being coupled together and applied to a power supply, the drain terminal of a first device of said third pair of logic devices being coupled to both source terminals of said first pair of logic devices and the drain terminal of a second device of said third pair of logic devices being coupled to both source terminals of said second pair of logic devices; and
  - a third pair of neutralizing reactive elements disposed in a cross-coupled arrangement between the drain and gate terminals of said third pair of logic devices.

36. An integrated circuit as defined in claim 35 wherein each reactive element comprises a capacitor.

37. An integrated circuit as defined in claim 36 wherein each neutralizing capacitor is formed to comprise a value essentially equal to an intrinsic capacitance existing between the gate and the drain of each logic device.

38. An integrated circuit as defined in claim 35 wherein the pair of input signal transmission lines comprise inductive transmission lines, the pair of clock input transmission lines comprise inductive transmission lines, and the pair of output transmission lines comprise inductive transmission lines.

* * * * *